(12) United States Patent
Landgraf et al.

(10) Patent No.: US 8,733,277 B2
(45) Date of Patent: May 27, 2014

(54) MASK SUPPORT, MASK ASSEMBLY, AND ASSEMBLY COMPRISING A MASK SUPPORT AND A MASK

(75) Inventors: Heike Landgraf, Bruchkobel (DE); Uwe Schussler, Aschaffenburg (DE); Stefan Bangert, Steinau (DE)

(73) Assignee: Applied Materials, Inc., Santa Clara, CA (US)

( * ) Notice: Subject to any disclaimer, the term of this patent is extended or adjusted under 35 U.S.C. 154(b) by 580 days.

(21) Appl. No.: 12/988,499

(22) PCT Filed: Dec. 1, 2008

(86) PCT No.: PCT/EP2008/066516
§ 371 (c)(1),
(2), (4) Date: Apr. 5, 2011

(87) PCT Pub. No.: WO2009/127272
PCT Pub. Date: Oct. 22, 2009

(65) Prior Publication Data
US 2011/0185561 A1    Aug. 4, 2011

Related U.S. Application Data

(63) Continuation of application No. 12/244,488, filed on Oct. 2, 2008, now abandoned.

(60) Provisional application No. 61/046,133, filed on Apr. 18, 2008.

(30) Foreign Application Priority Data

Apr. 18, 2008   (EP) .................................... 08103619
Oct. 2, 2008    (EP) .................................... 08165689

(51) Int. Cl.
| | | |
|---|---|---|
| B05C 11/00 | (2006.01) | |
| B23P 11/02 | (2006.01) | |
| B23P 11/00 | (2006.01) | |
| C23C 14/04 | (2006.01) | |
| G03F 7/12 | (2006.01) | |
| H05B 33/10 | (2006.01) | |
| B05C 21/00 | (2006.01) | |

(52) U.S. Cl.
CPC ............... *C23C 14/042* (2013.01); *C23C 14/04* (2013.01); *G03F 7/12* (2013.01); *H05B 33/10* (2013.01); *B05C 21/005* (2013.01)
USPC .................. 118/504; 118/71; 29/428; 29/446

(58) Field of Classification Search
None
See application file for complete search history.

(56) References Cited

U.S. PATENT DOCUMENTS 5,534,969 A * 7/1996 Miyake ........................... 355/53
2010/0285286 A1 * 11/2010 Middlesworth ............... 428/196

FOREIGN PATENT DOCUMENTS

JP    2007113022 A    5/2007

*Primary Examiner* — Dah-Wei D Yuan
*Assistant Examiner* — Jethro Pence
(74) *Attorney, Agent, or Firm* — Kilpatrick Townsend & Stockton LLP

(57) ABSTRACT

A mask support 10 comprises a frame element 20 and an elastic element 30. The elastic element 30 is fixed to the frame element 20. The elastic element 30 is a component integrally formed of a flexible material. It comprises a lever or arm portion 37 having a first engagement protrusion 38 extending in an angle of approximately 90° from the free end of the arm portion 37. A mask assembly 40 comprises a laminar mask 41, e.g. manufactured from a thin metal foil, and connecting elements 42. The connecting elements 42 include an engagement portion 43 for engagement with the engagement protrusion 38 of the elastic element 30. The mask 41 may be attached/stretched to the mask support 10 as well as to detached from the mask support 10 comfortably.

22 Claims, 4 Drawing Sheets

MASK SUPPORT, MASK ASSEMBLY, AND ASSEMBLY COMPRISING A MASK SUPPORT AND A MASK

FIELD OF THE INVENTION

The present invention relates to a mask support for supporting a mask, particularly for supporting a laminar mask for use in an OLED coating device, comprising a frame element and an elastic element. Furthermore, the present invention relates to a mask support for supporting a mask, particularly for supporting a laminar mask for use in an OLED coating device, comprising a plurality of elastic elements, wherein both a first elastic element and a second elastic element of the plurality of elastic elements comprise a lever or arm portion and a first engagement means arranged at the first elastic element and the second elastic element, respectively, for engagement with a corresponding second engagement means provided at the mask assembly for carrying the mask, wherein the elastic elements are configured for fixing the mask to the frame element and for stretching the mask supported in the frame element. Furthermore, the invention relates to a mask assembly provided for attaching a mask to a mask support comprising at least a mask and a connecting means for connecting the mask to the means for attaching the mask to the mask support. Moreover, the invention relates to an assembly comprising said mask support and said mask assembly.

PRIOR ART

In the production of OLED devices, e.g. OLED displays, shadow masks are used for generating a coating having a patterned structure on a substrate. Usually the masks are mask foils made of a thin metal sheet. In order to provide a reliable support and adjustment of the mask foil, the mask foil is fixedly connected with a frame element, e.g. by soldering. Alternatively, the mask may be removably fixed to the frame element, e.g. by screw fitting.

It is known that the production and the use of shadow masks in an OLED process cause considerable costs. When the mask foils are fixedly connected with mask frames, the number of masks required for every pattern and for a continuous production process is quite high. Furthermore, the reuse of mask frames having mask foils soldered thereto is limited due to the fact that exchanging a mask foil requires removal of material from the mask frame. Reusing the mask foils is not possible at all.

On the other hand, exchanging a mask foil fixed to the frame by a screw fitting connection is quite elaborate and time consuming.

Document EP 1 437 926 A1 discloses a metal mask which is fastened by a stationary mask clamp and a movable mask clamp. The stationary mask clamp is fixed to a base plate and the movable mask clamp is fixed to a slider by bolts. For stretching the mask coil springs are arranged between the base plate and the slider.

Document U.S. Pat. No. 5,534,969 discloses a mask support having a frame and pull-bars which pull the mask to be stretched by means of elastic springs. The pull-bars have hook members attached thereto which engage respective slots provided in the mask.

OBJECT OF THE INVENTION

It is an object of the present invention to provide an improved mask assembly which allows easy handling and exchange of masks used for the production of OLED devices, particularly for the production of optical devices and displays, wherein the mask assembly may be adapted to provide a required stretching force for a particular mask.

TECHNICAL SOLUTION

A mask support for supporting a mask, particularly for supporting a laminar mask for use in an OLED coating device, comprises a frame element and an elastic element, wherein said elastic element comprises means for attaching said mask to said frame element and for stretching said mask supported in said frame element.

According to an aspect of the invention the elastic element comprises a lever or arm portion which is rotatably mounted to said frame element, a mounting edge portion for mounting said elastic element to said frame element, and a curved portion arranged between said lever portion and said mounting edge portion.

The means for attaching the mask may comprise a first engagement means arranged at the elastic element for engagement with a corresponding second engagement means provided at the mask assembly carrying the mask.

Particularly, the first engagement means comprises a protrusion extending in an angle from the lever or arm portion.

Particularly, the engagement means is rotatably arranged at the frame element. The engagement means is arranged rotatably at the frame element to be rotated or swiveled around at least one axis of rotation. Particularly, the engagement means may be arranged to be able to be rotated around more than one axis and/or to be able to make a translational movement. This is due to the configuration of the elastic element.

According to another aspect of the invention the means for attaching said mask comprises a first engagement means arranged at said elastic element for engagement with a corresponding second engagement means provided at said mask assembly carrying said mask, wherein said first engagement means is configured to be rotatable around more than one axis of rotation and/or to be capable of making a translational movement relative to said frame element.

A mask support for supporting a mask, particularly for supporting a laminar mask for use in an OLED coating device, comprises a frame element and a plurality of elastic elements. Both a first elastic element and a second elastic element of the plurality of elastic elements comprise a first engagement means arranged at the first elastic element and the second elastic element, respectively, for engagement with a corresponding second engagement means provided at the mask assembly for carrying the mask, wherein the elastic elements are configured for fixing the mask to the frame element and for stretching the mask supported in the frame element by pushing an edge portion of said mask (41) away from said frame element. The first elastic element and the second elastic element are arranged adjacent to each other along a substantially straight edge of the frame element.

Attaching the mask to the frame element is accomplished by means of an elastic element, e.g. a tongue or spring, which engages corresponding connecting means (e.g. a cramp) provided at the mask foil. The elastic element is also a stretching device which, when being under tension, engages with the connecting means of the mask and which may be released from the mask when compressing the elastic element.

The means for attaching (fixing) the mask to the frame element concurrently stretch the mask while supporting it in the frame element. Therefore, as soon as the mask is fixed to the means for attaching the mask, the mask is at the same time stretched. Furthermore, it is quite easy to attach and detach the mask from the mask support due to the fact that fixing and stretching is carried out in one step as well as releasing the tension and detaching the mask from the mask support.

The invention is particularly useful for the production of OLED displays. By means of the invention a mask may be arranged in a stable position and stretched by providing an elastic element at each of the sides of the rectangular frame element. The present invention provides for a simple handling and exchange of structured mask foils, thus reducing the number of masks and mask frames required in a production process. Furthermore, the life cycle of a mask frame is extended due to the fact that detaching a mask is a gentle procedure and allows reuse of the mask and the mask frame.

When producing a mask in a conventional process the metal foil is positioned in a clamping fixture for processing, i.e. for providing a particular structure on the mask. The clamping fixture is particularly provided for processing the mask, whereas in the present invention the inventive mask support may be used for producing a mask as well as for using the mask in a coating process. Therefore, the number of process steps may be reduced, particularly detaching the mask from the clamping fixture after the production of the mask and attaching the mask to another frame for the coating process.

According to the invention a plurality of elastic elements may be used at each side of the (usually rectangular) frame element. There are at least a first and a second elastic element provided at a side of the frame element. Therefore it is easy to vary the characteristics of the elastic elements along a side of the frame element by varying the properties of the elastic elements arranged along a side of the frame element. By varying the properties of the elastic elements the stretching force may be varied, thus optimizing the shape and position of various mask layouts with respect to a plane, crease-free arrangement of the mask.

Attaching the mask to the frame element is accomplished by means of a plurality of elastic elements, e.g. tongues or springs, which engage corresponding connecting means (e.g. a cramp) provided at the mask foil. The cramp may be provided by bending the edge portion of the mask assembly to form an acute angle between the mask plane and the bent side. The elastic elements are also stretching devices which, when being under tension, engage with the connecting means of the mask and which may be released from the mask when compressing the elastic elements.

The characteristics of the elastic elements may be varied by different measures as described below.

It is preferred that the elastic elements are configured for detachably attaching the mask to the frame element.

Particularly, both the first elastic element and the second elastic element comprise a lever or arm portion, and the first engagement means of the first elastic element and the first engagement means of the second elastic element comprise a protrusion extending in an angle from the lever or arm portion.

It is preferred that both the first elastic element and the second elastic element comprise a curved portion arranged between the lever portion and a mounting portion for mounting the first elastic element and the second elastic element, respectively, to the frame element. By providing a curved portion the spring stiffness and/or spring deflection/spring travel may be increased without needing considerably more constructional space. Thus the height and/or the lateral extension of the mask support are independent from the required spring stiffness and/or spring deflection.

Particularly, the first elastic element and the second elastic element have a different structure. The structure or geometry may be varied in order to generate different properties, especially different tension, along a side of the mask assembly.

In a preferred embodiment of the invention the curved portion of the first elastic element and the curved portion of the second elastic element comprise a different number of curves. Varying the number of curves, e.g. varying the number of meanders along the length of the elastic elements between the mounting edge and the first engagement means, allows for a defined adjustment of the spring stiffness and/or spring deflection/spring travel.

The elastic element may be integrally formed of a flexible material. At least the flexible element may have a flexible portion.

It is preferred that the elastic element is arranged along at least a marginal edge of the frame element. Particularly, two opposite sides of the frame element may have an elastic element attached thereto. The elastic elements exert a force in order to stretch the mask in opposite directions.

It is preferred that the first engagement means of the first elastic element and the first engagement means of the second elastic element are movable relative to the frame element at least from a first position in which the elastic element is in a released state to a second position in which the elastic element is in a compressed state for locking the mask to the frame element and stretching the mask.

The first engagement means of the first elastic element and the first engagement means of the second elastic element are rotatably arranged at the frame element. The engagement means is arranged rotatably at the frame element to be rotated or swiveled around at least one axis of rotation. Particularly, the engagement means may be arranged to be able to be rotated around more than one axis and/or to be able to make a translational movement. This is due to the configuration of the elastic element.

The elastic elements may be integrally formed of a flexible material. At least the flexible element may have a flexible portion.

It is preferred that both the first elastic element and the second elastic element are arranged along at least a marginal edge of the frame element. Particularly, two opposite sides of the frame element may each have at least two elastic element attached thereto. The elastic elements exert forces in order to stretch the mask in opposite directions.

The first elastic element and the second elastic element may be configured to exert different stretching forces to the mask assembly.

In a preferred embodiment of the invention at least a portion of the first elastic element and a portion of the second elastic element are made of different materials. Because different materials have different spring stiffness the tension along the edge of the mask assembly may be varied.

In another preferred embodiment of the invention at least a portion of the first elastic element and a portion of the second elastic element have different thickness.

According to the invention a mask assembly provided for attaching a mask to a mask support as described above comprises at least a mask and a connecting means for connecting the mask to the means for attaching the mask to the frame element and for stretching the mask supported in the frame element. The connecting means comprises at least a second engagement means for mutual engagement with the first engagement means of the mask support.

The mask may be a laminar shadow mask, particularly a shadow mask processed from a metal sheet. A laminar mask is a shadow mask composed of a thin metal mask sheet which has a number of apertures to allow coating particles to pass the mask and form a pattern of material on a substrate. When using a mask, the apertures are polluted after some coating cycles. The present invention provides for an easy handling and exchange of masks from a mask support and for a quick attachment of a mask to a mask support.

In a preferred embodiment of the invention the second engagement means comprises a cramp, e.g. formed by bending at least an edge portion of the mask assembly or mask relative to the surface of the mask, thereby forming an acute angle for engagement of the first engagement means of the first and/or second elastic elements.

The object of the invention is also achieved by an assembly comprising a mask support as described above, and a mask assembly as described above.

Particularly, the mask is (detachably) attached to the mask support by means of a flexible force exerted by a compression of the elastic elements of the mask support, the first engagement means of the elastic elements being in engagement with the second engagement means of the mask assembly for supporting and stretching the mask attached to the mask support.

A method of connecting a mask assembly according to the invention with a mask support according to the invention includes a combination of two or more of the following steps: a) Inserting the mask support comprising the frame element and the elastic elements in a tensioning device; b) arranging the mask assembly comprising the mask and the connecting means on top of the mask support; and c) compressing the elastic elements by actuation of the tensioning device. Afterwards, according to step d) the connecting means of the mask assembly engages the elastic elements of the mask support as soon as releasing the elastic elements by actuation of the tensioning device. When releasing the elastic elements, they move in engagement with the connecting means of the mask assembly, thus connecting the mask foil with the frame element. Simultaneously, the elastic force of the elastic elements keeps the mask foil under tension.

The method may comprise a further step e) removing the assembly comprised of the mask assembly and the mask support from the tensioning device.

BRIEF DESCRIPTION OF THE DRAWINGS

Further features and advantages of the invention will be apparent from the following description of a preferred embodiment with reference to the appended drawings. The figures illustrate.

DETAILED DESCRIPTION OF A PREFERRED EMBODIMENT

Figure 1:
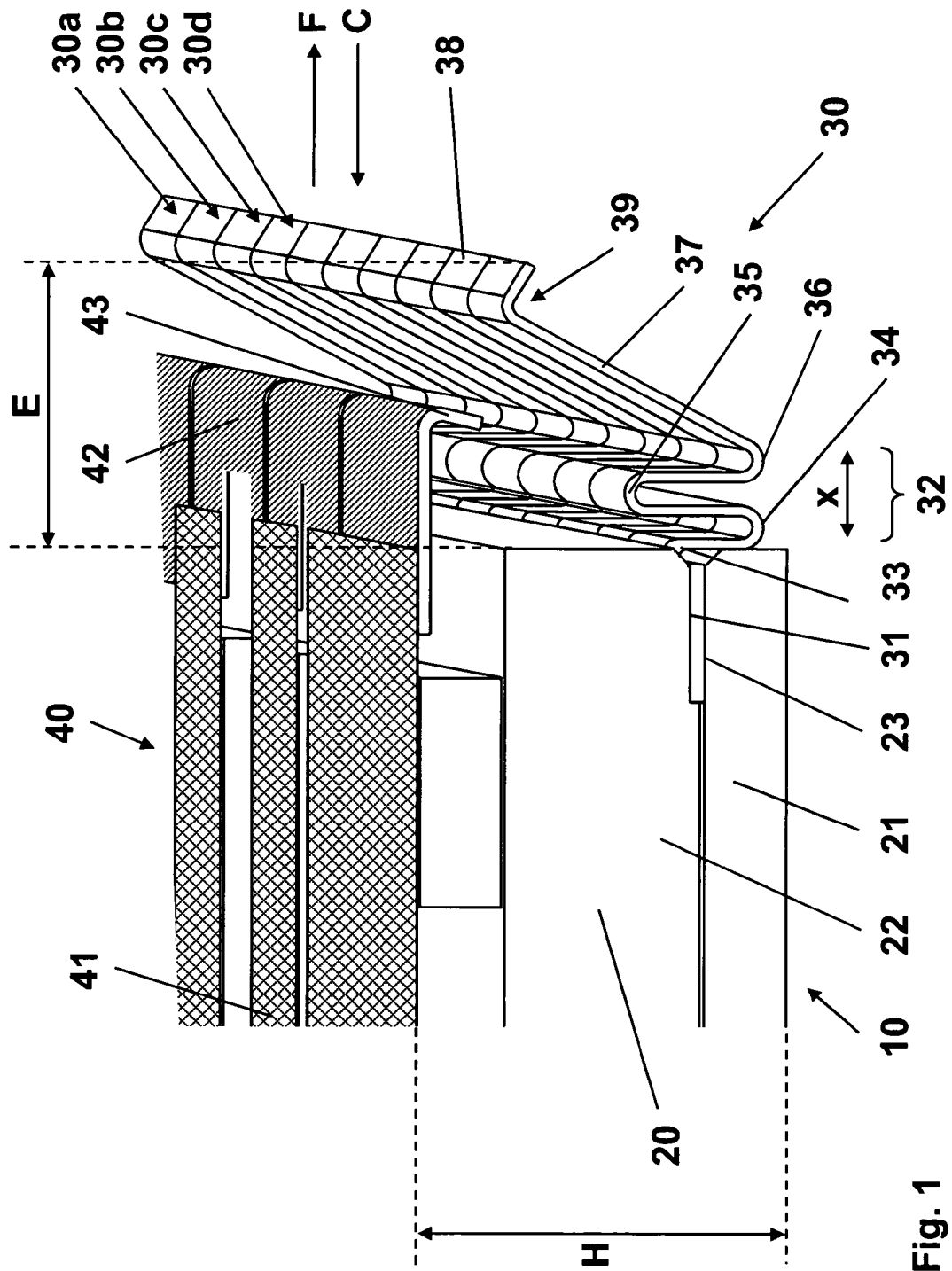
FIG. 1 a portion of a mask support according to the present invention and a mask detached from the mask support.

FIG. 1 illustrates a portion of a mask support 10 comprising a frame element 20 and an elastic element 30. The elastic element 30 is fixed to the frame element 20.

The frame element 20 comprises a first frame portion 21 and a second frame portion 22 and may have a rectangular or square configuration.

The elastic element 30 is a component integrally formed of a flexible material. It comprises a mounting edge portion 31 which extends into a recess 23 which is provided between the first frame portion 21 and the second frame portion 22 of the frame element 20 along a marginal side of the frame element 20. The mounting edge portion 31 is clamped between the first frame portion 21 and the second frame portion 22. One or a plurality of elastic elements 30 may be arranged along a marginal edge of the frame element 20 for enabling the elastic element to fix and stretch a mask attached to the mask support 10 in every direction.

Furthermore, the elastic element 30 comprises a curved portion 32 which is connected with the mounting edge portion 31. The curved portion 32 comprises a first bend 33 of approximately 90°, a second bend 34 of approximately 180°, a third bend 35 of approximately 180° and a fourth bend of an angle between 90° and 180°.

A lever or arm portion 37 is connected with the curved portion 32. The lever or arm portion 37 extends outwards away from the frame element 20. It comprises a first engagement protrusion 38 extending in an angle of approximately 90° from the free end of the arm portion 37 to form an engagement recess 39 between the arm portion 37 and the first engagement protrusion 38. The recess 39 is arranged relative to the arm portion 37 on the side opposite the frame element 20.

At least a portion of the elastic element 30, particularly the curved portion 32, is made of a flexible and/or elastic material such that the arm portion 37 and the first engagement portion 38 may be swiveled relative to the frame element 20 and the mounting edge portion 31. The arm portion 37 may be swiveled around at least one, particularly around a plurality of swivel axes. Due to the fact that the curved portion 32 comprises a number of bends 33, 34, 35, 36 the arm portion 37 may for example be swiveled around the apex axes of the bends. Furthermore, the arm portion 37 may also carry out a translational movement, e.g. by compressing or extending the curved portion 32 in a direction indicated by the arrow x.

In the embodiment illustrated in FIG. 1 the elastic element 30 is in an unloaded state. In this state the arm portion 37 extends in a predetermined angle relative to the frame element 20. When being compressed in a direction indicated by the arrow C the elastic element 30 may act like a spring or tongue and exert a counter force indicated by the arrow F.

As shown in FIG. 1, a mask assembly 40 comprising a laminar mask 41, e.g. manufactured from a thin metal foil, and connecting elements 42. The connecting elements 42 include an engagement portion 43 for engagement with the engagement protrusion 38 of the elastic element 30. In FIG. 1 the mask 40 is out of engagement with the mask support 10 and the elastic element 30. The mask 40 is released from the mask support 10. Thus the mask 40 and the elastic element 30 are detached from each other.

The connecting element 42 may be replaced by crimping the edge portion of the mask 41 to form an acute angle between a crimped tab and the surface of the mask 41. The recess defined between the crimped tab and the surface of the mask 41 corresponds to the engagement portion 43 of the connecting element 42. The advantage of crimping or bending a tab of the edge of the mask 41 is that the engagement portion 43 may be aligned perfectly. First, it is quite easy to bend the tab parallel or rectangular relative to an edge of the mask 41. Second, The length of each crimped tab portion along the edge of the mask 41 may be adjusted by forming gaps between the crimped tab portions, e.g. by use of a laser.

In the embodiment illustrated in FIG. 1 the elastic element 30 may be composed of a plurality of separated elastic elements $30a$, $30b$, $30c$, $30d$, . . . which are arranged adjacent to each other. Between the elastic elements $30a$, $30b$, $30c$, 30d, . . . there is a separation, e.g. a small gap. Thus the elastic elements 30a, 30b, 30c, 30d, . . . may be stretched or loaded independently.

Furthermore, the elastic elements 30a, 30b, 30c, 30d, . . . may have a different structure. The structure or geometry may be varied in order to generate different properties, especially different tension, along a side of the mask assembly 42. Each of the elastic elements 30a, 30b, 30c, 30d, . . . may be integrally formed of a flexible material. For example, the elastic elements 30a, 30b, 30c, 30d, . . . or some of the elastic elements 30a, 30b, 30c, 30d, . . . may be configured to exert different stretching forces to the mask assembly 42. Furthermore, the elastic elements 30a, 30b, 30c, 30d, . . . or some of the elastic elements 30a, 30b, 30c, 30d, . . . may be made of different materials or have different thickness. Therefore, the spring stiffness the tension along the edge of the mask assembly 42 may be varied.

Figure 2:
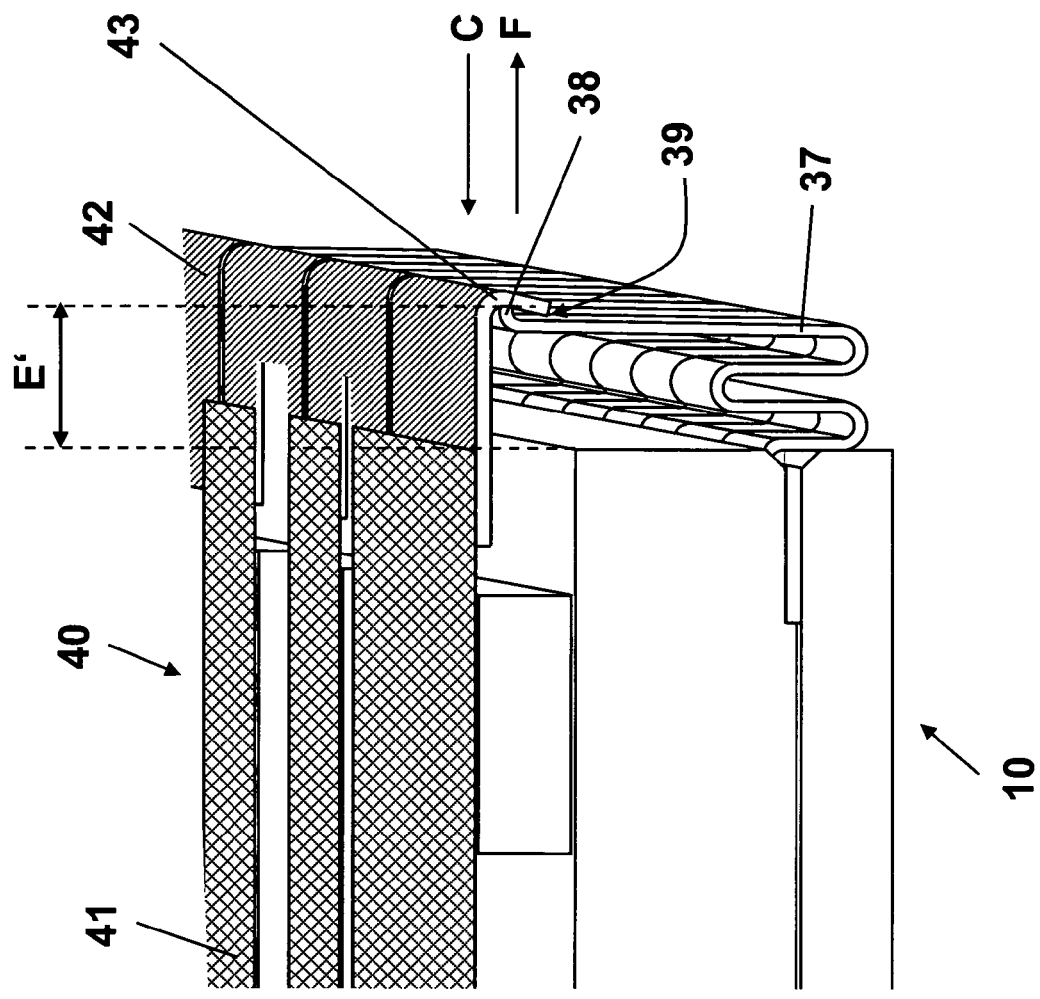
FIG. 2 a mask support according to the present invention and a mask attached thereto.

FIG. 2 shows the mask support 10 of FIG. 1 with the mask assembly 40 being attached to the mask support 10. In this state the engagement portions 43 of the connecting elements 42 are in engagement with the engagement protrusion 38 of the arm portion 37. The free end of the engagement portion 43 extends into the engagement recess 39 of the elastic element 30.

Thus the laminar mask 41 is fixed to the mask support 10 and stretched by a force F exerted by the elastic element 30 which had been compressed in order to fix the mask assembly 40 to the mask support 10. It is obvious that when attaching the mask assembly 40 to the mask support 10, the arm portion 37 has to be compressed in order to connect the connecting element 42 of the mask assembly 40 with the elastic element 30 of the mask support 10. The lever or arm portion 37 extends above a level defined by the frame element 20 in order to keep the mask 41 stretched in a plane above the frame element 20.

Thus, the mask assembly 40 is attached and stretched by the elastic element 30 concurrently. When releasing the mask assembly 40 from the mask support 10 a force C (greater than F) has to be applied to the arm portion 37 in order to compress and swivel the arm portion 37 to be able to unhook the connecting element 42 from the elastic element 30 and to remove the mask assembly 40 from the mask support 10.

It is obvious that it is quite easy and comfortable to attach/stretch the mask 41 as well as to detach the mask assembly 40 from the mask support 10.

By providing a curved portion having one or a plurality of curves 33, 34, 35 the spring stiffness may be controlled in a wide range by just determining the geometry of the elastic element 30. Furthermore, the deflection or extension E, E' (cf. FIGS. 1 and 2) of the elastic element 30 is quite small, whereas the spring stiffness is sufficient for stretching the mask 41. The elastic elements 30 exert a pushing shear force to the mask assembly 40 when stretching the mask 41 instead of a pulling tractive force. A respective edge portion 42 of the mask assembly 40 is pushed in a direction away from the frame element 20 by each of the elastic elements in order to hold and stretch the mask. Thus the constructional space needed for providing the inventive mask support 10 is small. Particularly the height H of the construction is limited and the longitudinal and lateral extension of the frame element 20 corresponds to the longitudinal and lateral extension of the mask assembly 40. The mask support 10 is thus quite compact.

Figure 3:
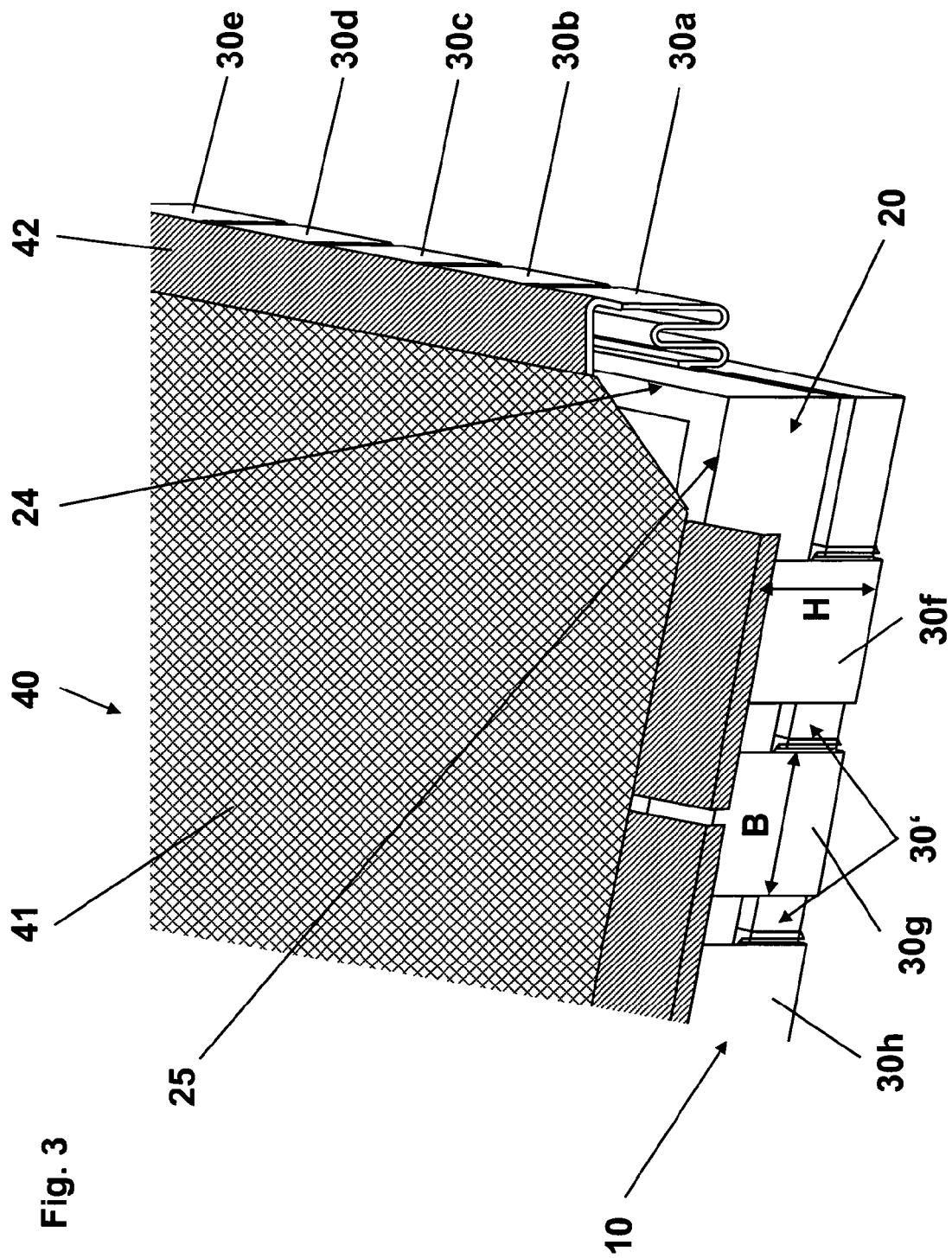
FIG. 3 a perspective view of an embodiment of a mask support according to the present invention.

FIG. 3 illustrates a portion of an embodiment of a mask support 10 according to the invention comprising a frame element 20 and a plurality of elastic elements 30a, 30b, 30c, 30d, 30e, 30f, 30g and 30h. The elastic elements 30a, 30b, 30c, 30d and 30e are arranged side-by-side along a first edge 24 of the frame element 20. The elastic elements 30f, 30g and 30h are arranged side-by-side along a second edge 25 of the frame element 20. The elastic elements 30 are arranged adjacent to each other along the respective edge 24, 25 with gaps 30' arranged between adjacent elastic elements 30.

The configuration of the elastic elements 30a, . . . 30h is the same as indicated in FIGS. 1 and 2. Due to the fact that the elastic elements 30a, . . . 30h comprise a curved portion 32, the height H of the elastic elements 30a, . . . 30h is substantially limited to the height of the frame element 20.

The configuration of the elastic elements 30a, . . . , 30h may be the same or different, i.e. the configuration of one or a plurality of elastic elements 30 may be different from the configuration of other elastic elements 30. For example, the number of curves formed in the curved portion 32, the geometry, the material, the thickness or the width B of at least two elastic elements 30 may be different. By controlling these parameters, a particular elastic element 30 may be configured to have particular characteristics, e.g. a particular spring force corresponding to a translational or rotational force of the lever portion 37. By providing different elastic elements 30 along an edge portion of the frame element 20 the mask 41 may be more or less stretched at different positions along the edge 42 of the mask assembly 40. Thus, the stretching force may be adapted to each particular mask design.

Figure 4:
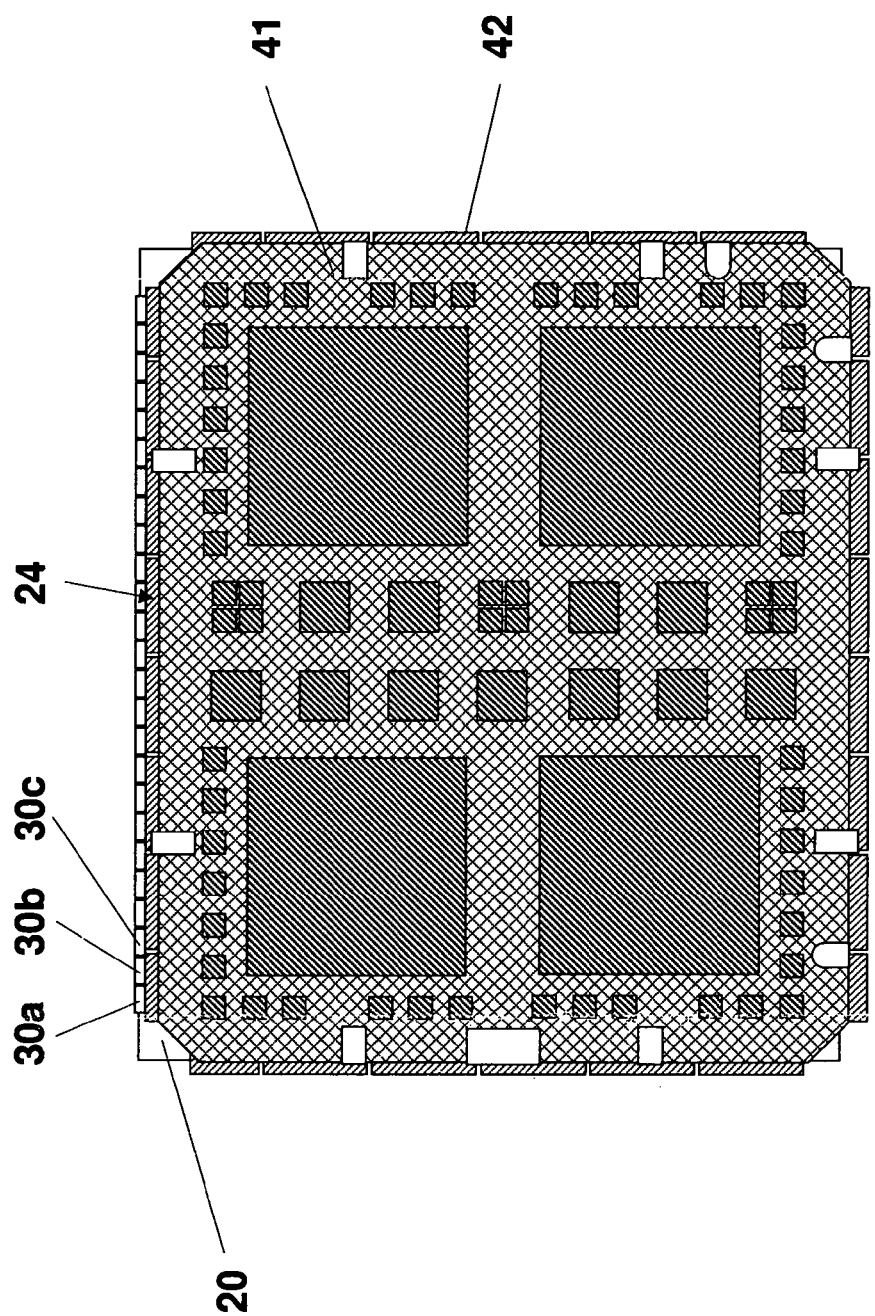
FIG. 4 a top view of an embodiment of a mask support according to the present invention.

FIG. 4 shows a plan view of a mask assembly 40 comprising a mask 41 and connecting elements 42 held at a frame element 20 by means of elastic forces exerted by a plurality of elastic elements 30a, 30b, 30c, . . . . The elastic elements 30a, 30b, 30c, . . . are arranged side-by-side along an edge portion 24 of the frame element 20.

It is obvious from FIG. 4 that the longitudinal and lateral extension of the frame element 20 substantially corresponds to the longitudinal and lateral extension of the mask assembly 40. This is due to the fact that the elastic elements 30a, 30b, 30c, . . . provide a shear force pushing the edges 42 of the mask 41 away from the frame element 20, i.e. the extension of the frame element 20 corresponds to or is somewhat smaller than the surface of the mask assembly 40. Because the height H of the elastic elements 30 and the frame element 20 is also limited, the construction of the mask support 10 is very compact.

The invention claimed is:

1. A mask support for supporting a mask, for supporting a laminar mask for use in an OLED coating device, comprising a frame element and an elastic element, wherein said elastic element comprises means for attaching said mask to said frame element and for stretching said mask supported in said frame element, characterized in that said elastic element comprises a lever or arm portion which is rotatably mounted to said frame element, a mounting edge portion for mounting said elastic element to said frame element, and a curved portion arranged between said lever or arm portion and said mounting edge portion, wherein said curved portion is formed of a plurality of bends and wherein said arm portion swivels around at least one axis of rotation which corresponds with an apex axis of at least one bend of said plurality of bends.

2. The mask support of claim 1, characterized in that said means for attaching said mask comprises a first engagement means arranged at said elastic element for engagement with a corresponding second engagement means provided at a mask assembly carrying said mask.

3. The mask support of claim 2, characterized in that wherein said first engagement means comprises a protrusion extending in an angle from said lever or arm portion.

4. The mask support of claim 2, characterized in that said first engagement means is rotatably arranged at said frame element.

5. A mask support for supporting a mask, for supporting a laminar mask for use in an OLED coating device, comprising a frame element and an elastic element, wherein said elastic element comprises means for attaching said mask to said frame element and for stretching said mask supported in said frame element, characterized in that said means for attaching said mask comprises a first engagement means arranged at said elastic element for engagement with a corresponding second engagement means provided at a mask assembly carrying said mask, and further characterized in that said elastic element comprises a lever or arm portion which is rotatable mounted to said frame element, a mounting edge portion for mounting said elastic element to said frame element, and a curved portion arranged between said lever or arm portion and said mounting edge portion, wherein said first engagement means is configured to be rotatable around more than one axis of rotation and/or to be capable of making a translational movement relative to said frame element, and wherein said curved portion is formed of a plurality of bends and wherein said arm portion swivels around at least one axis of rotation which corresponds with an apex axis of at least one bend of said plurality of bends.

6. The mask support of claim 5, wherein said first engagement means comprises a protrusion extending in an angle from said lever or arm portion.

7. The mask support of claim 1, characterized in that said means for attaching said mask is provided for detachably attaching said mask to said frame element.

8. The mask support of claim 2, characterized in that said first engagement means is movable relative to said frame element at least from a first position in which the elastic element is in a released state to a second position in which the elastic element is in a compressed state for locking the mask to the frame element and stretching said mask.

9. The mask support of claim 1, characterized in that said elastic element is integrally formed of a flexible material.

10. The mask support of claim 1, characterized in that said elastic element is arranged along at least a marginal edge of said frame element.

11. A mask support for supporting a mask, for supporting a laminar mask for use in an OLED coating device, comprising a frame element and a plurality of elastic elements, wherein both a first elastic element and a second elastic element of said plurality of elastic elements comprise a first engagement means arranged at said first elastic element and said second elastic element, respectively, for engagement with a corresponding second engagement means provided at a mask assembly for carrying said mask, characterized in that said elastic elements are configured for fixing said mask to said frame element and for stretching said mask supported in said frame element by pushing an edge portion of said mask away from said frame element, and said first elastic element and said second elastic element are arranged adjacent to each other along a straight edge of said frame element, and further characterized in that at least one of said plurality of elastic elements comprises a lever or arm portion which is rotatable mounted to said frame element, a mounting edge portion for mounting said elastic element to said frame element, and a curved portion arranged between said lever or arm portion and said mounting edge portion, wherein said curved portion is formed of a plurality of bends and wherein said arm portion swivels around at least one axis of rotation which corresponds with an apex axis of at least one bend of said plurality of bends.

12. The mask support of claim 11, characterized in that said elastic elements are configured for detachably attaching said mask to said frame element.

13. The mask support of claim 11, wherein said first engagement means of said first elastic element and said first engagement means of said second elastic element comprise a protrusion extending in an angle from said lever or arm portion.

14. The mask support of claim 11, characterized in that said first elastic element and said second elastic element have a different structure.

15. The mask support of claim 14, characterized in that said curved portion of said first elastic element and said curved portion of said second elastic element comprise a different number of curves.

16. The mask support of claim 11, characterized in that said first engagement means of said first elastic element and the first engagement means said second elastic element are movable relative to said frame element at least from a first position in which the respective elastic element is in a released state to a second position in which the elastic element is in a compressed state for locking the mask to the frame element and stretching said mask.

17. The mask support of claim 11, characterized in that said first engagement means of said first elastic element and said first engagement means of said second elastic element are rotatably arranged at said frame element.

18. The mask support of claim 11, characterized in that both said first elastic element and said second elastic element are integrally formed of a flexible material.

19. The mask support of claim 11, characterized in that both said first elastic element and said second elastic element are arranged along at least a marginal edge of said frame element.

20. The mask support of claim 11, characterized in that said first elastic element and said second elastic element are configured to exert different stretching forces to said mask assembly.

21. The mask support of claim 11, characterized in that at least a portion of said first elastic element and a portion of said second elastic element are made of different materials.

22. The mask support of claim 11, characterized in that at least a portion of said first elastic element and a portion of said second elastic element have different thickness.

* * * * *